(12) United States Patent
Qin (10) Patent No.: US 8,837,139 B2
(45) Date of Patent: Sep. 16, 2014

(54) FLAT HEAT PIPE RADIATOR AND APPLICATION THEREOF

(76) Inventor: Biao Qin, Guangdong (CN)

( * ) Notice: Subject to any disclaimer, the term of this patent is extended or adjusted under 35 U.S.C. 154(b) by 248 days.

(21) Appl. No.: 12/733,924

(22) PCT Filed: Jul. 28, 2008

(86) PCT No.: PCT/CN2008/071772
§ 371 (c)(1),
(2), (4) Date: Mar. 24, 2010

(87) PCT Pub. No.: WO2009/043240
PCT Pub. Date: Apr. 9, 2009

(65) Prior Publication Data
US 2010/0220439 A1 Sep. 2, 2010

(30) Foreign Application Priority Data

Sep. 29, 2007 (CN) .......................... 2007 1 0077392
Jun. 18, 2008 (CN) .......................... 2008 1 0067795
Jun. 18, 2008 (CN) .......................... 2008 1 0067796

(51) Int. Cl.
*G06F 1/20* (2006.01)
*H05K 7/20* (2006.01)
*F28F 7/00* (2006.01)
*H01L 23/427* (2006.01)
*H01L 23/467* (2006.01)

(52) U.S. Cl.
CPC .............. *G06F 1/203* (2013.01); *H01L 23/427* (2013.01); *H01L 23/467* (2013.01); *G06F 2200/201* (2013.01)
USPC . 361/679.47; 361/697; 361/700; 361/679.52; 165/80.4; 257/715; 257/722

(58) Field of Classification Search
CPC ..... H01L 23/427; H01L 23/467; G06F 1/203; G06F 2200/201; H05K 7/20336; H05K 7/20136–7/20163
USPC .............................. 361/700, 679.47, 679.52; 165/80.4–80.5, 104.33; 257/714–715, 257/E23.088; 174/15.2
See application file for complete search history.

(56) References Cited

U.S. PATENT DOCUMENTS

| | | | |
|---|---|---|---|
| 6,643,129 B2 * | 11/2003 | Fujiwara ................... | 361/679.47 |
| 6,659,169 B1 * | 12/2003 | Lopatinsky et al. .......... | 165/121 |
| 7,447,030 B2 * | 11/2008 | Hwang et al. ................ | 361/700 |
| 7,650,928 B2 * | 1/2010 | Bhatti et al. ................. | 165/80.3 |
| 7,688,590 B2 * | 3/2010 | Cheng et al. ................. | 361/700 |
| 7,742,295 B2 * | 6/2010 | Hata et al. ................. | 361/679.47 |
| 2004/0105233 A1 * | 6/2004 | Lai ................................. | 361/695 |
| 2005/0280988 A1 * | 12/2005 | Wyatt et al. .................. | 361/687 |
| 2006/0011324 A1 * | 1/2006 | Rogers et al. ................ | 165/80.3 |
| 2006/0077637 A1 * | 4/2006 | Ishikawa ....................... | 361/703 |
| 2008/0011454 A1 * | 1/2008 | Hwang et al. ................ | 165/80.3 |
| 2008/0105410 A1 * | 5/2008 | Hwang et al. ............ | 165/104.33 |

* cited by examiner

*Primary Examiner* — Zacharay M Pape
(74) *Attorney, Agent, or Firm* — Novoclaims Patent Services LLC (57) ABSTRACT

A flat radiator with flat type heat pipe and its application for portable computers is provided. The heat pipe in a radiator use tubular type and plate type structures. An air convective extended heat exchange surface surrounds and is over against the fan impeller, such that the radiator is extremely compacted, and the heat transport distance in heat pipe is shortened. Further introducing enhanced convective heat transfer structure and setting the fins according to the aerodynamics improve the heat dissipating capacity. The restrictions to a radiator when installing are reduced, which helps to implement the standardization of the radiator series. Also portable computers using the radiator are provided.

1 Claim, 9 Drawing Sheets

FLAT HEAT PIPE RADIATOR AND APPLICATION THEREOF

BACKGROUND OF THE PRESENT INVENTION

1. Field of Invention

The present invention relates to an electronic heat dissipating device, and more particularly to a flat radiator with heat pipe and centrifugal fan for using in portable electronic devices, such as for cooling the electronic chips (CPU or GPU) in portable (notebook) computer.

2. Description of Related Arts

As the higher demands of thinner and multi-functional portable devices, especially the CPU and GPU, the thermal design for the heat dissipating of the whole system has become a bottleneck to the improvement of portable computer's performance. The radiator affixed to the CPU or GPU is like the shell on a snail, and it has occupied quite much room of the portable computer, so cutting down the thickness of portable computer is restricted by the radiator.

The structure of the radiator of current notebook computer is as follows. It has a centrifugal fan with a shell, which is usually a helicoid shaped shell and has a centralized air outlet. The air convective extended heat exchange surface, which is usually a fin structure, briefly called fin, is located at the air outlet. Usually heat pipes are used to transport the heat produced by the CPU to the fin.

The disadvantages of this design include the followings. First, the air outlet is easily blocked, it will cause that the heat can't be dissipated. Second, the wind driven by the fan is directly vented after flowing through the fin, and is unable to be further utilized. Next, the shell of the fan takes up much room of the fan, so that in order to reduce the volume, the shape of the shell isn't standard helicoid shape, which results in much more air vortex loss, and asymmetrical air flow at the air outlet, and it is unbeneficial for heat dissipation. Last, because of the restriction of the line layout, the CPU should be located near the center of the motherboard, so that the distance between the fin and the CPU is so long that long heat pipes are needed, and the distance between the vaporizing area and the condensing area of the heat pipe is longer, and the heat transport capacity becomes less.

Due to the heat dissipation of the CPU and GPU, no standardization of the notebook radiator has been formed, and the inner structure of notebook is also diversified. Different series of notebook have different structures, even the same series have different structures just because of the problem of the heat dissipation. It increases much more cost to the notebook, while its performance can not compare with the desktop computer. It also restricts people to extend their devices like the desktop computer.

SUMMARY OF THE PRESENT INVENTION

In order to conquer the disadvantages of the above, the present invention changes the position of the fin, so that the shell of the fan is left out, and the distance between the vaporizing area and the condensing area of the heat pipe is shortened, and a intensified heat transfer structure is introduced to reduce the size of the fin. So the radiator's structure is simpler, smaller and thinner, and the heat transfer capacity is higher. So we can make out thinner and more convenient portable computers with simpler structure, and the standardization of its inner structure can be realized.

The blue print of the present invention is as follow: The radiator comprises heat pipe, air convective extended heat exchange surface and centrifugal fan. The shape of the whole radiator is flat shape like. The characteristics of the present invention are that: the fin structure or pin structure are adopted in the air convective extended heat exchange surface, which is bonded or welded on the heat pipe; the air convective extended heat exchange surface surrounds the fan impeller, facing the air outlet of impeller, so that the air from the fan impeller is blew directly into the air convective extended heat exchange surface.

The fin structure of air convective extended heat exchange surface is the most popular, it is a kind of structure that increases the area of air convection heat exchange effectually and cuts down the size to make the radiator compact, for example, it is used in the condenser and evaporator of air-condition. The present radiator of CPU has this structure too.

The pin structure is not popular because of the high manufacturing cost, but the air convection heat transfer coefficient is more than twice of the fin structure. Compact structure and small size are very important for notebooks, so the pin structure is also adopted too.

The characteristic of the air convective extended heat exchange surface being welded on or bonded on the condensation area segment of the heat pipe includes that there are cushions between the extended surface and the heat pipe because of arts and crafts needed, and it will not increase the thermal resistance evidently. Bonding or welding directly not only can reduce thermal resistance, but also can reduce the cost.

Welding can eliminate the contact thermal resistance, but the welding temperature is so high, that there is a high risk of explosion of the heat pipe. The temperature of the pasting method is low, and there is no risk of explosion, but the thermal conductivity of the pastern must be high, the contact area between the two must also be large and the two should be pressed firmly to reduce the clearance between them. The pasting method is not suitable for the pin fin.

Usually heat pipes are tubular structure, whose both ends are blocked, the interior is vacuum and filled with working fluid. The present invention adopts not only tubular structure, but also plate type. For the plate heat pipe, the ratio of its width with its thickness is so large that it can only be curved to the thickness direction. In the present invention, the ratio is decided to be more than 5, it is named plate heat pipes differentiate from tubular heat pips.

The heat pipe of tubular structure is simple, and low cost. While the plate heat pipe has the advantages as follow: The circulation area of working fluid is larger because of its wider cross-section area (comparing with tubular heat pipe), its thickness can be thinner with high heat transport, so the thickness of radiator can be reduced efficiently; It has enough large even area as the heat-absorbing surface, the electronic chips to be cooled can be pasted on the heat-absorbing surface directly, or through a conduction block, contact conduction area is wide, and vaporizing area of heat pipe inside is wide, too.

The outer circle of the centrifugal fan impeller is the air outlet of the impeller, when the impeller rotating, air flows out equably from the outer circle of the impeller. The air convective extended heat exchange surfaces are set to surround the impeller, and are facing to the air outlet of the impeller, so the air coming from the impeller goes into the air convective extended heat exchange surface directly. The advantages of this structure are as follows.

1. Increasing the length of setting the air convective extended heat exchange surface, it results in that the speed of the air through the air convective extended heat exchange surface can be reduced, so as to have lower airflow resistance, and more air flux.

2. The fan can be set at a position near the electronic chips for cooling thereof, wherein this structure shortens the distance between vaporizing area and condensing area of heat pipe very much, so as to increase the heat transport capacity of the heat pipe.

3. Abandoning the fan shell of fan is one of the most significant advantages, it saves the room, weight and cost of the shell, and also saves the room of diffusion channel in the shell, and avoids the air vortex loss in the shell. The air from the radiator can not be vented out of the mainframe shell directly, and can be used to cool other components any more.

4. The extended surface of the air convection heat exchange can be arranged in square, polygon or other shapes to surround the impeller of the fan. However, the best way is to arrange the extended surface of air convection heat exchange circularly around the impeller, wherein the gap between the heat exchange surface and the impeller is as small as possible. Therefore, the reasons of the above are as described as follows. First, the air can flow uniformly through the air convective extended heat exchange surface, without the influence of some placket or block surrounding the impeller. Second, it further saves the room between the extended surface and the impeller.

Now the radiator of the present invention just only make up of heat pipe, fan and air convective extended heat exchange surface, and there is no other part can be left out. The gap between impeller and heat exchange surface is necessary for avoiding impeller to be collided or clamped.

It explains hereinbefore that arranging the air convective extended heat exchange surface to surround the impeller of fan is the most compact structure. In order to cut down the size of the radiator further, we can only make some improvement on the air convective extended heat exchange surface and the fan, for example: Adopting the structure of strengthening convection heat transfer, to increase the coefficient of the convection heat transfer; Increasing the density of the fin, it can increase the area of heat exchange surface not only, and also the coefficient of the convection heat transfer can be improved; Optimizing the design of the impeller and increasing the rotate speed to cut down the diameter or thickness of the impeller.

In the present invention, at least half of air convective extended heat exchange surface is needed to be arranged in an arc shape to surround the impeller of fan, it is just to indicate that the air outlet of the impeller should be utilized effectually to set the air convective extended heat exchange surface for decreasing idle room.

There is no wind cover and centralized air outlet, so the position of the radiator is not limited very much, it can be placed anywhere on the motherboard following CPU and GPU as long as keeping the air inlet unblocked. The radiator becomes a smaller and lighter part which does not take up the much room in the notebook computer any more, so that radiator can be divided into some series according to the heat dissipating capacity and thickness, and to establish standardization of the radiator, so that we can establish the standardization of the notebook case and the motherboard.

These and other objectives, features, and advantages of the present invention will become apparent from the following detailed description, the accompanying drawings, and the appended claims.

DETAILED DESCRIPTION OF THE PREFERRED EMBODIMENT

Figure 1:
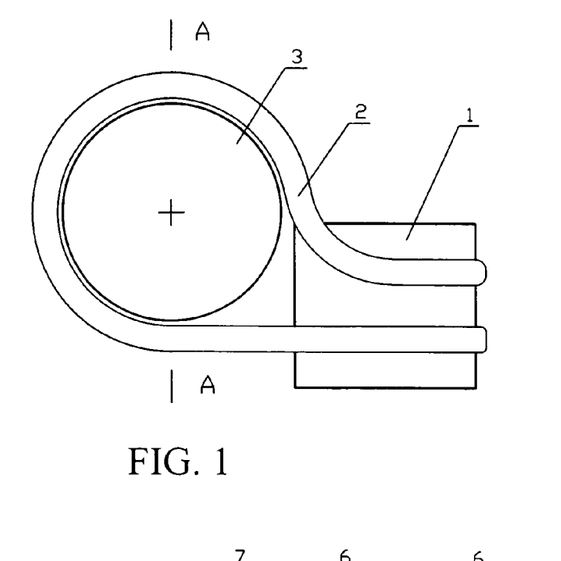
FIG. 1 is a perspective rear view of a flat radiator with heat pipe according to a preferred embodiment of the present invention, illustrating a rear view of a heat absorbing surface of a conduction block.

FIG. 1 shows the characteristic structure of one kind of the present invention radiator with tubular type of tubular structure heat pipe, wherein an air convective extended heat exchange surface 4 is not shown in the FIG. 1. The heat pipe 2 surrounding impeller 3 is one integrative pipe, and its both ends are vaporizing segment which is on the back of conduction block 1. There is an even surface called heat-absorbing surface on the obverse side of conduction block 1.

Usually the welding or mosaic technology is adopted to set the vaporizing segment of the heat pipe with the conduction block together, for decreasing the contact thermal resistance; The conduction block 1 abuts against the impeller 3 to cut down the distance between the vaporizing area and the condensing area effectually. Because of the limit of bending radius, the heat pipe can not be bended to surround the whole impeller (360°), there is an opening near the conduction block 1, as FIG. 1 shows, one end of the heat pipe 2 is extended straight to the conduction block 1, the other is curved to the conduction block 1, so there is an opening between them. We can make the most use of every part of the pipe by setting the air convective extended heat exchange surface 4 on the part of the extended pipe to the conduction block 1.

Figure 2:
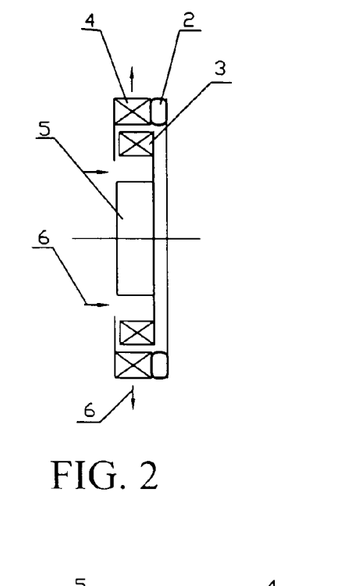
FIG. 2 is a sectional view of the flat radiator according to the preferred embodiment of the present invention, illustrating an A-A section of the FIG. 1 of an air convective heat transfer part of the flat radiator.

FIG. 2 shows the characteristic structure of air heat convection transfer unit which comprises a fan 5, a heat pipe 2 and an air convective extended heat exchange surface 4. The heat pipe 2 is a tubular structure, the fan 5 is a centrifugal type, air flows axially in and radially out, as the arrow 6 shows, the outer circle of the impeller 3 is the air outlet. The air convective extended heat exchange surface 4 faces to the air outlet of the impeller 3, the air coming from the impeller 3 goes into the air convective extended heat exchange surface 4 directly. To reduce the periphery size of the air convective extended heat exchange surface 4 which surrounds the impeller 3, namely to reduce the size of the radiator, the gap between the impeller 3 and the air convective extended heat exchange surface 4 should be as small as possible, but we should make sure that the impeller 3 can not come into contact with the air convective extended heat exchange surface 4 or the heat pipe 2.

Figure 3:
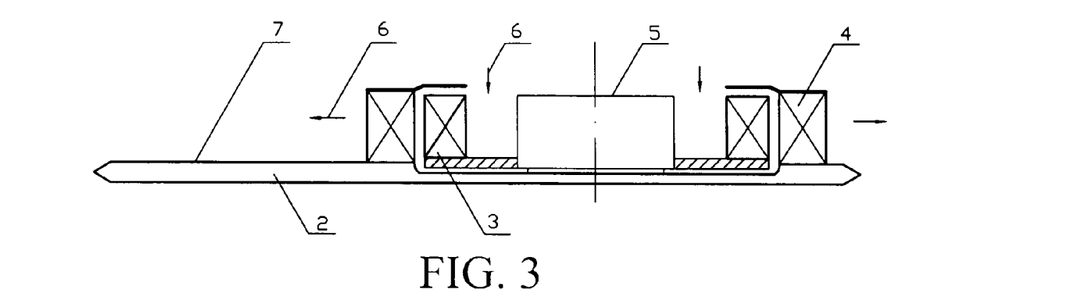
FIGS. 3, 4 and 6 are the sectional views of three flat types of heat pipes of the flat radiator according to the preferred embodiment of the present invention.
Figure 4:
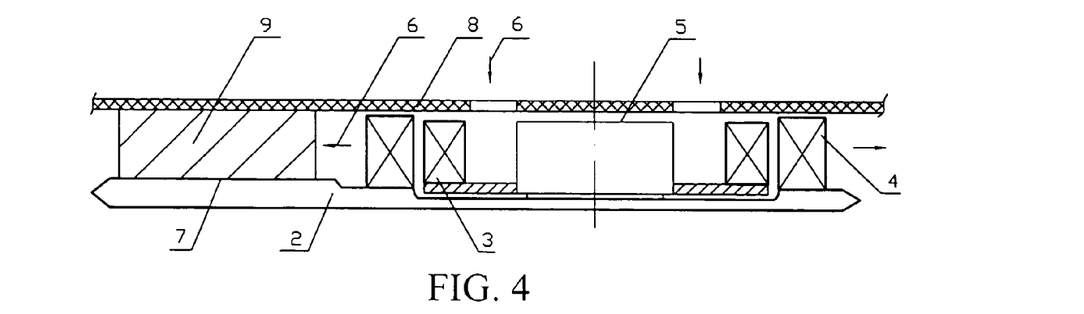

FIG. 3 shows the characteristic structure of one kind of the present invention radiator with plate structure heat pipe. The heat pipe 2 is a plate structure, and the air convective extended heat exchange surface 4 is set on the heat pipe 2 directly, and the next is the heat-absorbing surface 7. The part of the heat pipe 2 at the fan is designed to be concave to increase the height of the blades of the impeller 3 and motor, so to increase the air flux without thickening the radiator. In order to prevent the hot air out of the radiator from flowing back to the air inlet of fan, we can use the PCB 8 or a device fixed on the PCB 8 as one sidewall of the fan 5, and open an air inlet there, as FIG. 4 shows, it is good not only for separating the air inlet from the outlet effectually, but also decreasing the fan's thickness. Introducing to portable computer, the air from the radiator can be used to cool other components and bring heat out of the computer case. In FIG. 4, the part of the heat pipe 2 on the heat-absorbing surface 7 is thickened, it is to make use of room effectually and to increase the circulation area of working fluid in the heat pipe, and to improve the heat transfer capacity.

Figure 5:
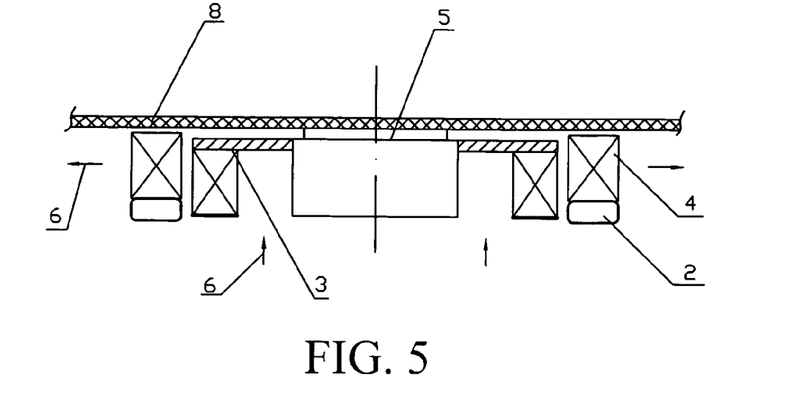
FIGS. 5 and 7 are the sectional views of two tubular types of heat pipes of the radiator according to the preferred embodiment of the present invention.

As the fan motor is needed to run continually for a long time, even sometimes in a super speed, so the life of the fan motor is finite. While the life of the heat pipe and air convective extended heat exchange surface are longer than the fan motor. For the maintaining of the fan easily, the fan and the heat transfer unit (composing of the heat pipe and the air convective extended heat exchange surface) can be fixed separately, as FIG. 5 shows, the fan 5 is fixed directly on the PCB (motherboard) 8, and can be easily dismantled or installed without the heat transfer unit being moved.

Figure 6:
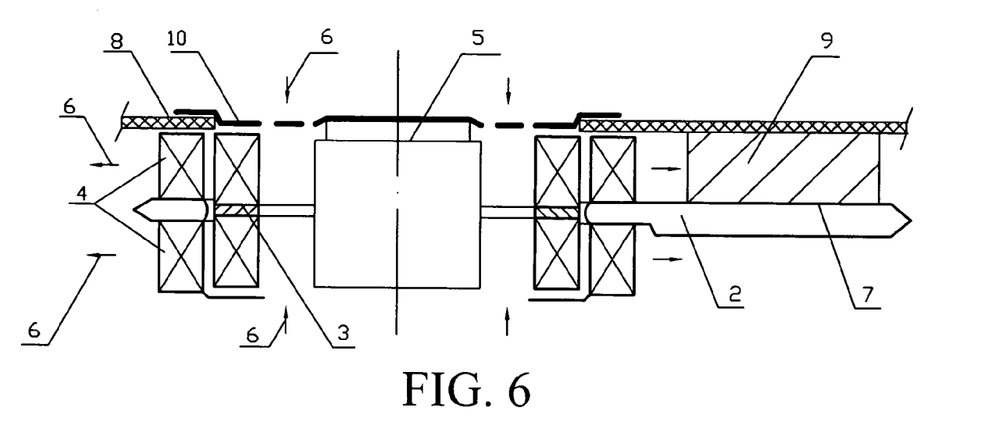
Figure 7:
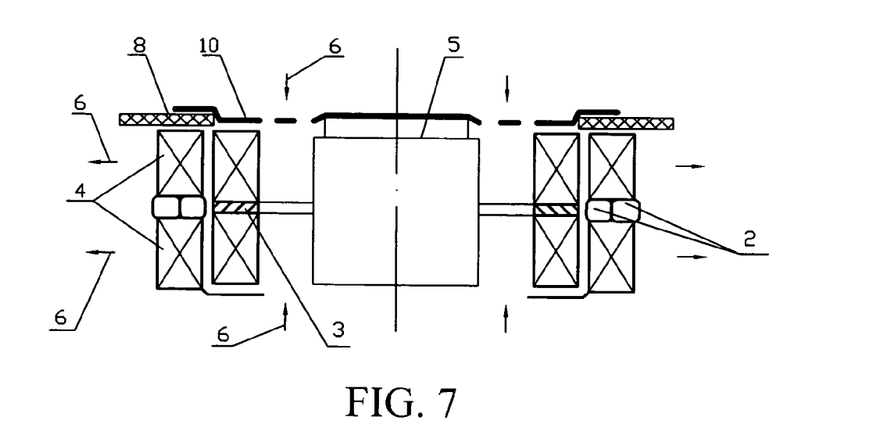

It is beneficial to the heat dissipating capacity to heighten the air convective extended heat exchange surface, but when the total height of the air convective extended heat exchange surface is more than 10 mm, the air convective extended heat exchange surface should be divided into two parts, and set on the two sides of heat pipe 2 separately, as FIG. 6 shows, it can reduce the distance between the root and top of the air convective extended heat exchange surface, that is usually called fin height or fin length, and improve the fin efficiency, so the heat dissipating capacity can be increased. In FIG. 6, the fan 5 is fixed on the PCB 8 by the fixing plate 10, and can be installed or dismantled from the PCB 8 directly, there is an opening 9 in the middle of the heat pipe 2, and the fan 5 is set in the opening. The fan 5 has two air inlets at each side of the fan, so the air inlet vortex loss can be reduced, and the air flux being increased. Once one side of the air inlet is blocked, there is still the other one, so the reliability is improved. In FIG. 6, the part of the heat pipe 2 at the heat-absorbing surface 7 is thickened. What is FIG. 7 shown is similar to that FIG. 6 shows, the difference between them is that the heat pipe in FIG. 6 is a plate type, while it is tubular type in FIG. 7.

In order to reduce the radiator thickness, and to increase the ventilation area of the air convective extended heat exchange surface 4, and to reduce the air flowing resistance, the heat pipe of tubular structure should be flat, especially when the heat pipe 2 is in single-row. The heat pipe 2 shown in FIGS. 2 and 5 is flat tubular type in single-row. Also we can use more than one tubular heat pipe being set side by side, as FIG. 7 shows, there are two tubular heat pipes, it has the advantage as follows. The diameter (or equivalent diameter) can be reduced, so the bending diameter of the heat pipe can be reduced too, and it is good for the radiator to be compacted. Of course, the cost would be a little higher.

Figure 8:
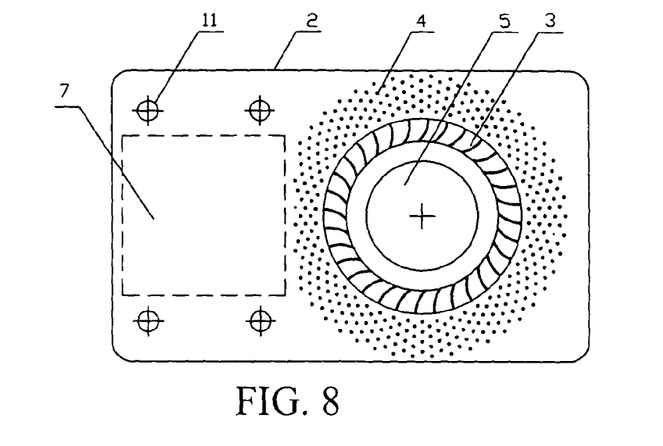
FIGS. 8, 9, 11, and 12 are front views of four flat types of heat pipes of the flat radiator according to the preferred embodiment of the present invention.

FIG. 8 shows the obverse characteristic structure of one kind of the present invention, and the heat pipe 2 is plate structure, the extended surface of air convective heat exchange 4 surrounds the impeller 3 circularly. To reduce the room of the radiator, the gap between the impeller 3 and the air convective extended heat exchange surface 4 should be as small as possible, but it must make sure that the impeller 3 can not touch the air convective extended heat exchange surface 4. The air convective extended heat exchange surface 4 is a pin structure, the heat-absorbing surface 7 abuts against the air convective extended heat exchange surface 4, so to reduce effectually the distance between the vaporizing area of the heat pipe 2 (where heat-absorbing surface 7 is) and the condensing area of the heat pipe 2, it is good for the heat transport in the heat pipe. There are four screw holes 11 on the heat pipe 2 to fix the heat pipe 2, to make the heat-absorbing surface 7 being pressed tightly on the electronic chip to be cooled, to reduce the contact thermal resistance.

Figure 9:
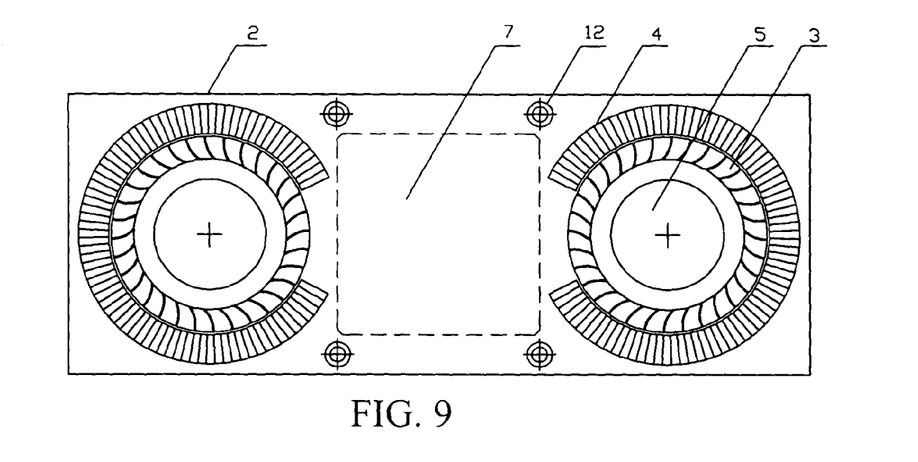
Figure 10:
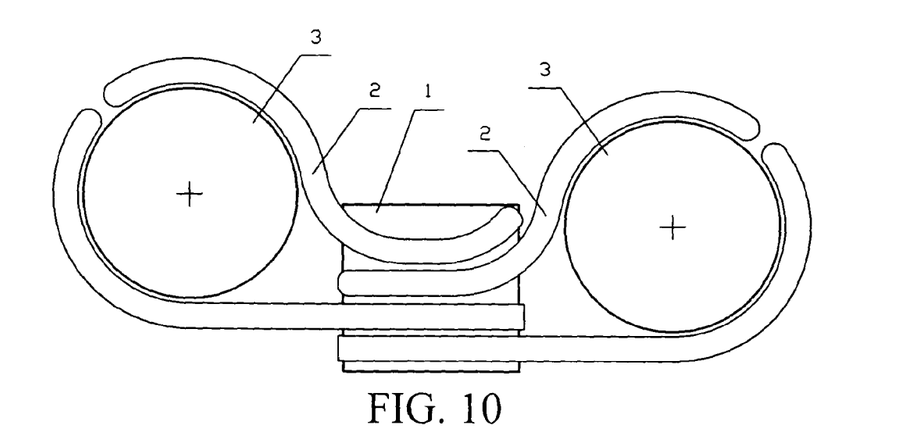
FIGS. 10, and 13 are rear views of two tubular types of heat pipes of the radiator according to the preferred embodiment of the present invention.

It's not a good idea to increase the diameter of the air convective extended heat exchange surface 4 and the impeller 3 for improving heat dissipating capacity, because it will increase the average distance that the working liquid flows back from the condensing area to the vaporizing area in heat pipe, which is not good for heat transport in heat pipe. The diameter of the impeller 3 shouldn't be more than 60 mm. Heightening the air convective extended heat exchange surface and thickening the fan to improve the heat dissipation will thicken the radiator, it is rather bad for aspiring after a thin notebook computer. We can make a heat pipe with two or more fans and air convective extended heat exchange surfaces surrounding the impellers, to solve the contradiction between improving heat dissipating capacity and thinning the radiator. As FIG. 9 shows, the heat pipe 2 is a plate structure, there are two impellers 3 and air convective extended heat exchange surface 4 on the heat pipe 2, the heat-absorbing surface 7 is between them. As shown in FIG. 10, the heat pipe 2 is a tubular structure, and the conduction block 1 is fitted with the two impellers 3.

In FIG. 9, the air convective extended heat exchange surface 4 is a fin structure. In order to reduce the distance between the vaporizing area and the condensing area, the two fans 5 are closed to heat-absorbing surface 7, the part of the fin conflicting with the chip to be cooled is taken out, as FIG. 9 shows, there are openings in the heat exchange surface 4. FIG. 9 also shows that there are four nuts 12 which can be welded on the heat pipe 2.

Figure 11:
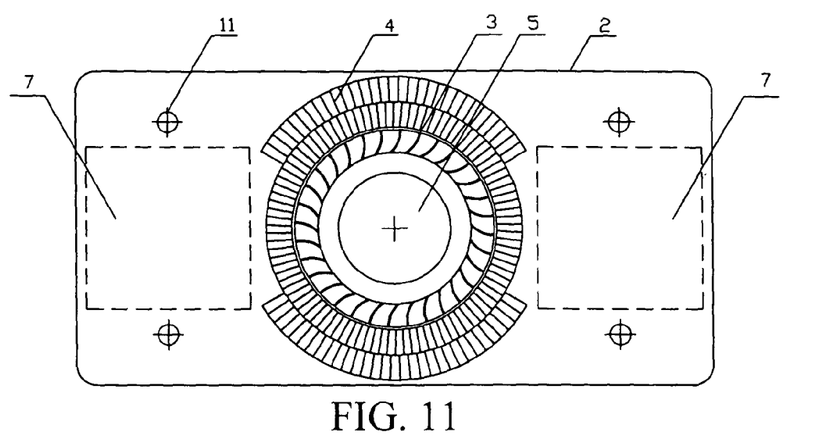

When there are two or more chips to be cooled on a PCB, we can use this means: one fan takes on two or more heat-absorbing surfaces, as FIG. 11 shows, there are two heat-absorbing surfaces 7 on the heat pipe 2, while only one fan 5 and an air convective extended heat exchange surface 4.

Figure 12:
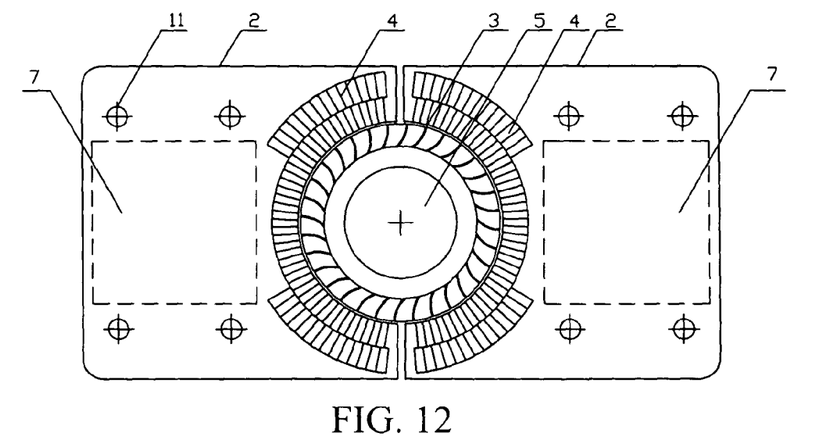
Figure 13:
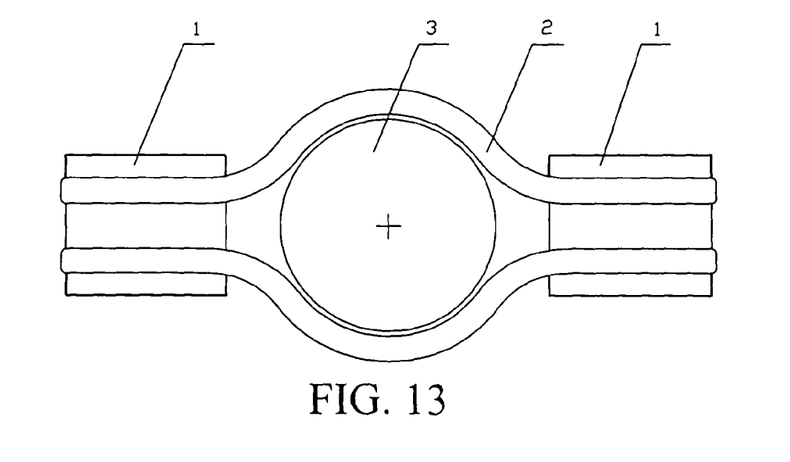

As FIG. 12 shows, there are two heat pipes 2, but only a fan 5, and there is half of the air convective extended heat exchange surface 4 on each heat pipe 2. The heat pipes 2 in FIGS. 11 and 12 are a plate structure. In FIG. 13, the heat pipe 2 is a tubular structure, there are two conduction blocks 1, two heat-absorbing surfaces, but only one fan.

Figure 14:
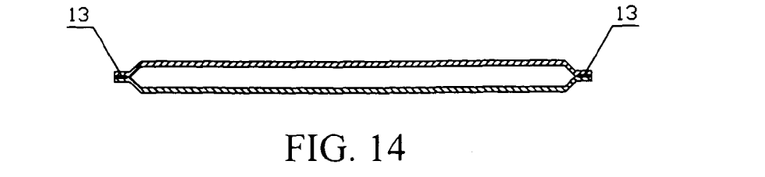
FIGS. 14, 15, 16, and 17 are sectional views of four flat types of heat pipes of the flat radiator according to the preferred embodiment of the present invention.
Figure 15:
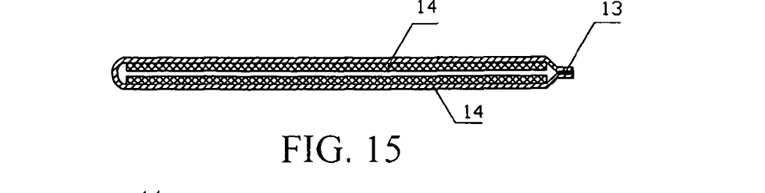
Figure 16:
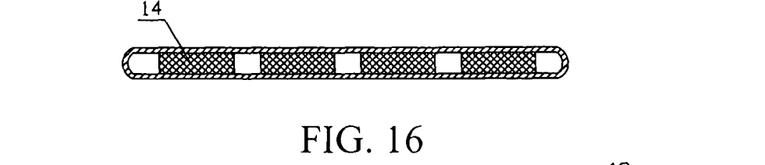

FIGS. 14, 15, 16, and 17 show four kinds of typical plate type heat pipe. The heat pipe in FIG. 14 is without wick, the working liquid in the heat pipe flows back from the condensing area to the vaporizing area by gravity mainly, so one end of the heat pipe must be higher, the vaporizing area (namely the location of the heat-absorbing surface) is lower. As FIG. 14 shows, the heat pipe is made of two metallic plates (generally pure copper) which are welded together by resistance welding or brazing. In FIG. 15, the heat pipe has wick 14 inside, and is made of one metallic plate. In FIG. 16, the heat pipe is made of flat pipe with wick 14 inside, it's similar to the tubular heat pipe. We can use the exhaust means to fill working liquid and seal the ends, wherein firstly, fill the heat pipe with some working liquid, then heat up or vacuum the pipe, later, when the liquid is boiling, the steam is dissipated with the air out the pipe, lastly, seal the ends when there is no air in the pipe.

The wick 14 in FIGS. 15 and 16 is different from the one in FIG. 14. The wick 14 in FIG. 15 is set on the two wainscots with interspaces between them as steam channels. In FIG. 16, the steam channel is divided into several channels, there are five as shown in the figure. The wick 14 is a capillary structure, a porous structure is usually used, such as sintered powder and metallic felt.

Figure 17:
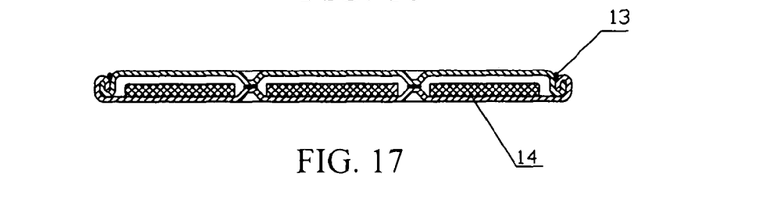

In FIG. 17, the heat pipe is made of two metallic plates too, the two metallic plates are connected together with buckle and welding, and there are welding points at the middle of the heat pipe inside, the intensity of this structure is high. Usually water is used as working liquid, when the temperature of water is more than 100° C., the pressure in the heat pipe is more than the atmospheric pressure. If there aren't enough welding points or lines, the heat pipe will be swelled. So there should be enough welding points or lines at the middle of the pipe inside.

Figure 18:
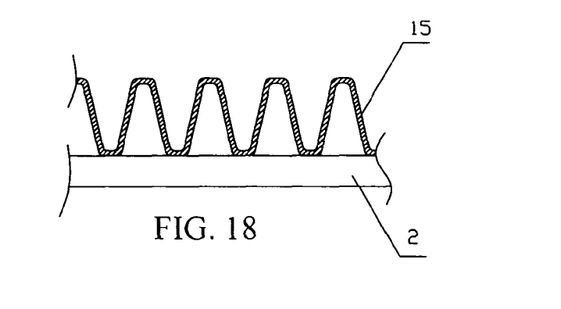
FIG. 18 is a perspective view of a corrugated type fin of the flat radiator according to the preferred embodiment of the present invention.

The fin structure is most widely used as the air convective extended heat exchange surface, so we choose this kind firstly, and the fin is called for this kind of air convective extended heat exchange surface for short. The corrugated structure fin is usually used in the air heat exchanger, so it is used in this invention too. The fin 15 in FIG. 18 is a corrugated structure, it is made of coiled sheet being rippled, and set on the heat pipe 2 usually by welding technology, because the contact area between the fin 15 and the heat pipe 2 is so small, that it can't make sure to solve the problem of contact heat resistance between them by adhesive bonding technology.

Figure 19:
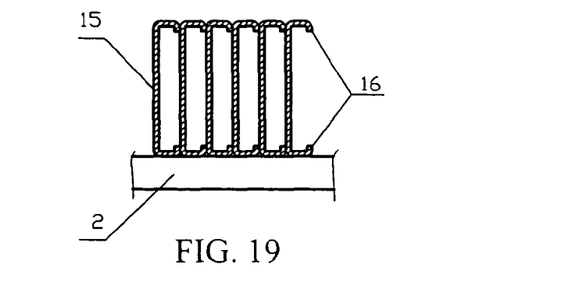
FIG. 19 is a perspective view of a laminated type fin of the flat radiator according to the preferred embodiment of the present invention.

FIG. 19 shows a kind of laminated type fin, there is a hem at root of the fin 15, and the hem clings on the heat pipe 2, the heat from the heat pipe 2 is transferred to the fin 15 through the hem by contact heat transfer. Because the contact area between the hem and the heat pipe is wide, the hem can be easily pressed tightly on the heat pipe 2, so we can use adhesive bonding technology besides the welding technology to solve the contact heat resistance between the fin 15 and the heat pipe 2. To make sure the distance between the fin blades even and for high production efficiency, there are location hems 16 at the root hem and the top hem each, just as FIG. 19 shows.

Figure 20:
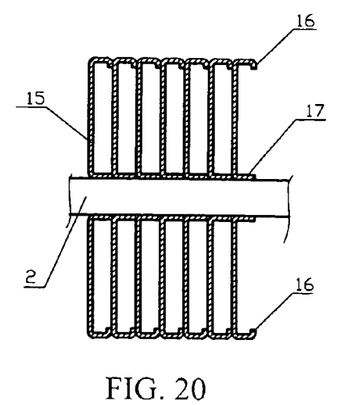
FIG. 20 is a perspective view of a sleeve type fin of the flat radiator according to the preferred embodiment of the present invention.

In the present invention, the sleeve structure fin is also adopted, there are flanging holes in the sleeve structure fin, the heat pipe goes through the flanging holes, the flanging is called sleeve flanging, as FIG. 20 shows, heat from the heat pipe 2 is transferred to the fin 15 just by the contact of the sleeve flanging 17 with the heat pipe 2. To make sure the distance between fin blades, and for high production, there are location hems 16 on the fin 15.

At the air outlet of the impeller, namely, the outer circle of the impeller, the air speed can be separated into radial velocity and circumferential velocity. If the impeller shape is different, the distribution of the radial velocity and circumferential velocity is different, for the forward curved blade, the circumferential velocity is higher than that of backwards curved blade. Whatever type of impeller the circumferential velocity exists, and its direction accords with the direction of the impeller rotating.

Figure 21:
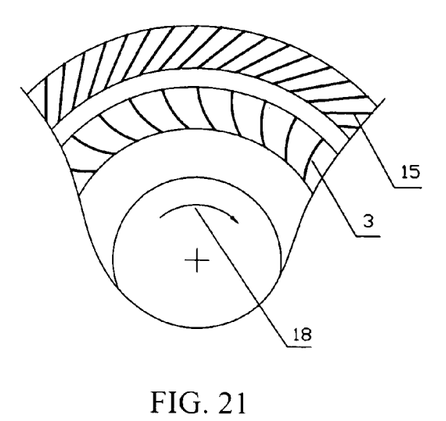
FIGS. 21, 22, and 23 are partially perspective views of impeller and fin of the flat radiator according to the preferred embodiment of the present invention.

When the fins set at the air outlet of the impeller are arrayed radially, there is an angle, called attack angle in aerodynamics, between the front edge of the fin and the direction of the airflow out of the impeller. When the attack angle is bigger, the flowing resistance of the air flowing through fins is bigger, and it will cause reducing of the air flux, that is bad for heat dissipation. In order to cut down the attack angle, the fin 15 surrounding the impeller 3 can be set to incline forward the rotating direction of the impeller 3, as FIG. 21 shows.

Figure 22:
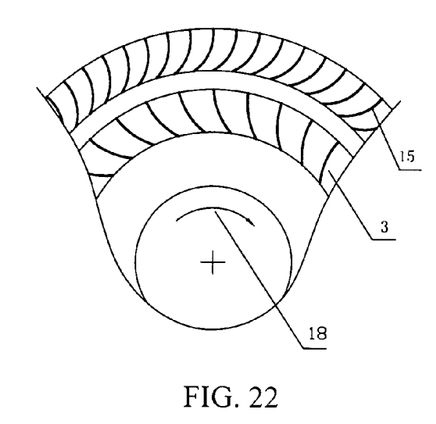

We can also curve or bend the air inlet front edge of the fin 15 surrounding the impeller 3 against the rotating direction of the impeller 3, as FIG. 22 shows, the fin 15 is curved, the channels between the fin 15 blades are for diversion diffuser, so the fin 15 is not only for air convection heat transfer, but also diversion and diffusion. For the pin structure there is no direction or attack angle in the air flow.

Figure 23:
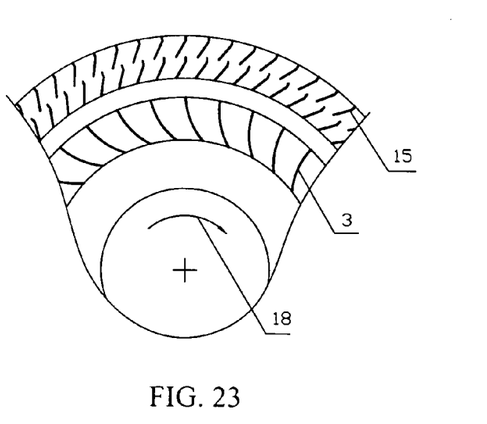
Figure 24:
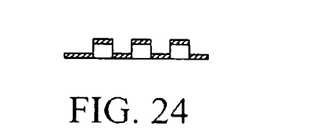
FIG. 24 is a sectional view of a staggered short fin for intensifying heat transfer of the flat radiator according to the preferred embodiment of the present invention.
Figure 25:
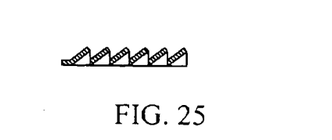
FIG. 25 is a sectional view of a Louvered short fin for intensifying heat transfer of the flat radiator according to the preferred embodiment of the present invention.

In order to cut down the fin size, intensified air convection heat transfer structure is used for the fin. FIGS. 24 and 25 show two kinds of short fin structure for intensifying convection heat transfer, the fin as FIG. 24 shows is the staggered short fin structure, and FIG. 25 shows the louvered short fin structure. Their basic characters are: the surface which the air flows over is cut into several discontinuous segments, when the air washing every segment, the boundary layers are all at theirs start bit, so that the whole air convective heat exchange surface make use of the advantage of thinner boundary layer of start bit, so that is less heat resistance and higher coefficient of air convection heat transfer. When setting fins of louvered structure to surround the impeller, we must pay attention to the bend direction of the louvered fin, the edge of air inlet should be bended against the rotating direction of the impeller, as FIG. 23 shows.

According to the heat transfer study, the coefficient of the air convection heat transfer is inversely proportional to the space between the fin blades, so that shortening the fin space can not only increase the number of fin blades (the heat convection area), but also increase the air convection heat transfer coefficient. The best fin space should be less than 1.0 mm, but we should think about other factors during designing.

As to the continuous plain fin structure, the space between fin blades should be not more than 1.5 mm, thinking of the manufacturing and dust infecting, the space between fin blades should be more than 0.8 mm. And as to the short fin structure for intensifying heat transfer, the space between the fin blades should be more than 0.8 mm and not more than 2.0 mm, the width of the short fin is about 2.0 mm. In the present invention, the fins are arranged in arc, the space between fin blades is smaller at the inner round and bigger at the outer round, so the numeric space between fin blades above is average space.

Figure 26:
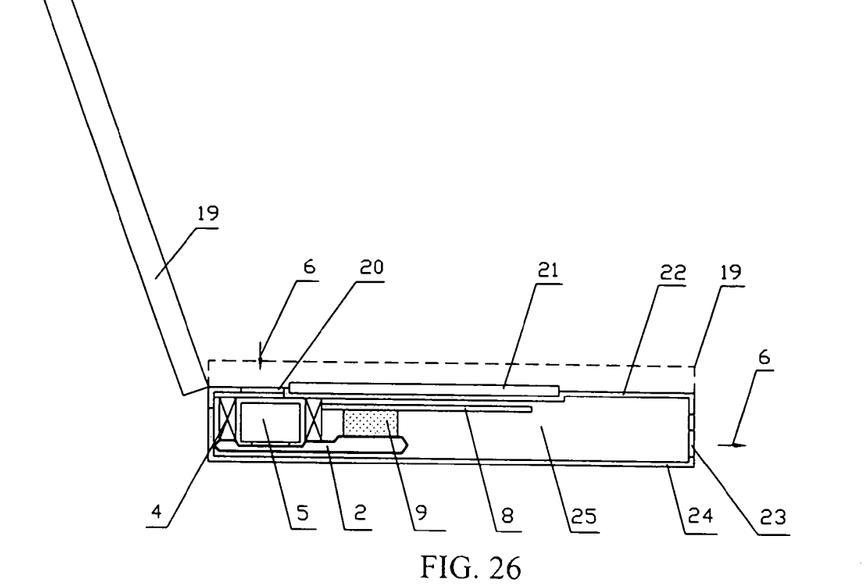
FIGS. 26, 27, and 28 are another perspective views of three flat types of heat pipes of the flat radiator according to the preferred embodiment of the present invention, illustrating each of the flat types of heat pipes incorporating with the portable computers having similar structure as the existing portable computers.

FIG. 26 shows the typical characteristic of a kind of notebook computer which introduces the present invention radiator, wherein the heat pipe is a flat plate type. It comprises a display screen 19 and a mainframe 25. There are a motherboard 8, the battery and hard disc (not shown in the Figure) in the mainframe. The display screen 19 and the mainframe 25 are connected by a linking device, when using the notebook computer, the display screen 19 is erected, and the mainframe 25 lies. The keyboard 21 is on the top of shell of the mainframe, the display screen 19 and the mainframe 25 can be folded together, just like the broken line shown in the Figure, it is similar to the notebook computer nowadays. The characters include that the shell of the mainframe 25 is made up of an upper shell 22 and a nether shell 24, and the motherboard 8 is close to or pasted on the inner wall of upper shell 22, and is fixed on it, better by screws. The CPU or GPU 9 is on the down face of the motherboard 8. The radiator is fixed on the motherboard 8, or the upper shell 22 through the motherboard 8. The hard disk is fixed or hanged on the upper shell 22 directly, or through the motherboard 8. The upper shell is the primary architecture, while the nether shell is just a cover and can be made of plastic, so that it is convenient to install or replace the radiator, the battery, the hard disk, the CD-ROM and so on. The whole structure is compact, and it is good for design standardization.

In FIG. 26, there is an air inlet 20 facing the inlet of the fan 5 on the upper wall of the upper shell 22. This structure can reduce the air resistance when air flows in. There should be several air outlets 23, which are as far as possible from the air inlet 20, it can prevent the hot air from flowing back to the air inlet 20. The connection between the upper shell 22 and the nether shell 24 can be screws, buckles or both two.

Figure 27:
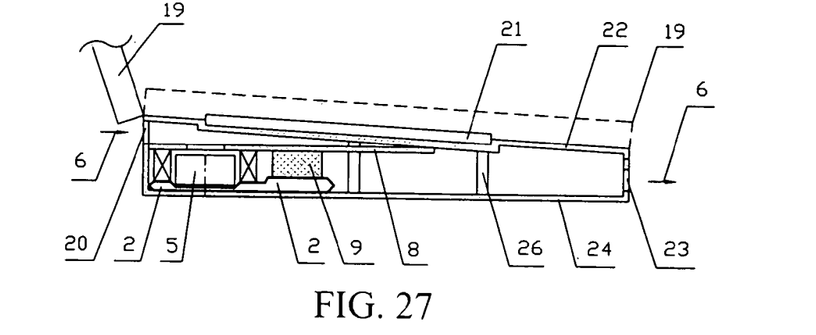

In FIG. 27, the air inlet 20 is set on the sidewall of the mainframe shell, it can reduce the probability of the air inlet being blocked. There is an airflow orifice opened in the motherboard 8, just facing the inlet of the fan. The motherboard 8 here is used for separating the inlet cold wind from the outlet hot wind, to prevent the hot air from flowing back to the inlet of the fan. The upper shell 22 leans, forming an angle with the motherboard 8 to make the channel of air inlet 20 being large enough. In FIG. 27, there are puncheons 26 between the upper shell 22 and the nether shell 24, the pressure which the upper shell 22 sustains can be transferred to the nether shell 24 by puncheons 26, it can increase the strength of upper shell 22 and reduce the concave deformation.

Figure 28:
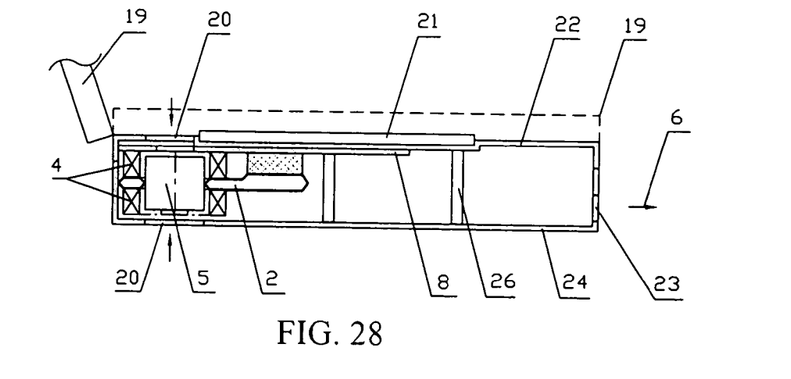

In the portable computer shown in FIG. 28, the radiator is similar to that shown in FIG. 6 in structure. The air convective extended heat exchange surface 4 has two layers, the fan 5 has two air inlets on its top and bottom, and there are inlets 20, facing fan 5 air inlets, on the upper shell 22 and the nether shell 24.

Nowadays notebook's keyboard also has function of air inlets and heat dissipation, there are vent holes under the keyboard, if some water is splashed into the keyboard, the circuit may be destroyed. In the present invention, keyboard is not needed for heat dissipation, so we can use film buttons that are not only thin, but also can prevent from water, and the cost is a little.

Figure 29:
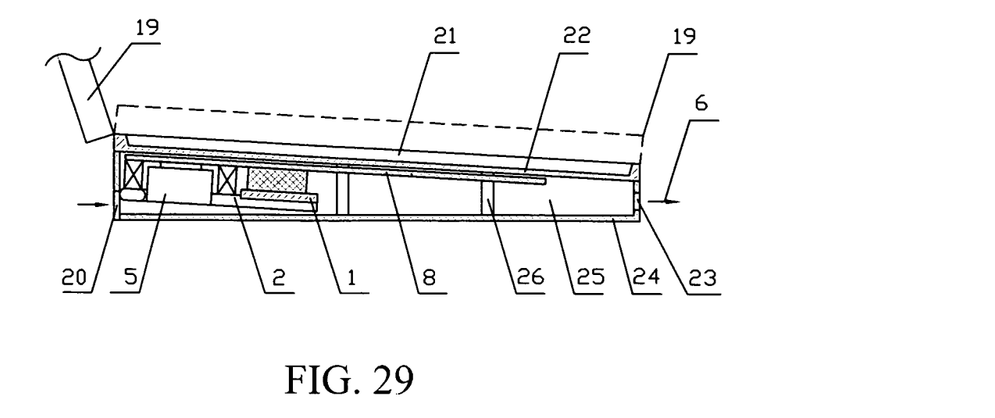
FIG. 29 is another perspective view of the flat tubular type of heat pipe of the flat radiator according to the preferred embodiment of the present invention, illustrating the flat tubular type of heat pipe incorporating with the portable computers having similar structure as the existing portable computers.

In FIG. 29, the keyboard 29 is a touch panel keyboard, if with a display screen, it can be a handwriting board. It becomes a double display computer with the function of keyboard and display. If the display screen 19 is designed to be removed easily from the mainframe 25, the mainframe 25 becomes a flat-panel computer.

Figure 30:
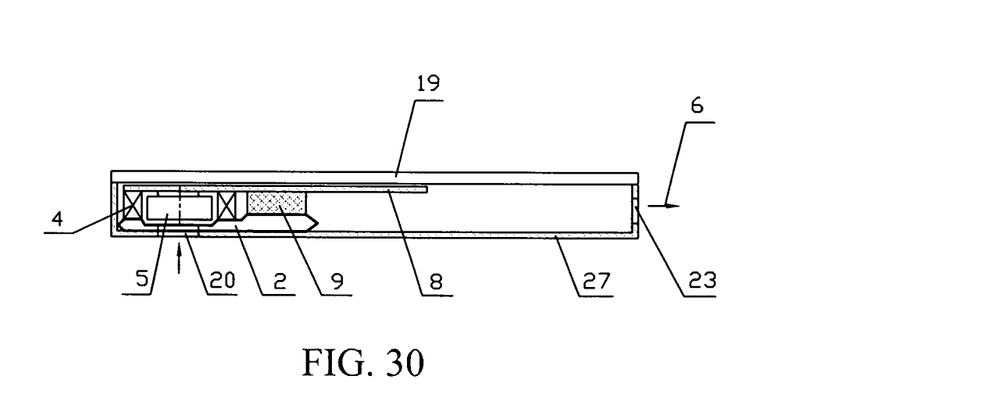
FIGS. 30 and 31 are another perspective view of the flat type of heat pipe of the flat radiator according to the preferred embodiment of the present invention, illustrating the flat type of heat pipe incorporating with the flat type portable computers.
Figure 31:
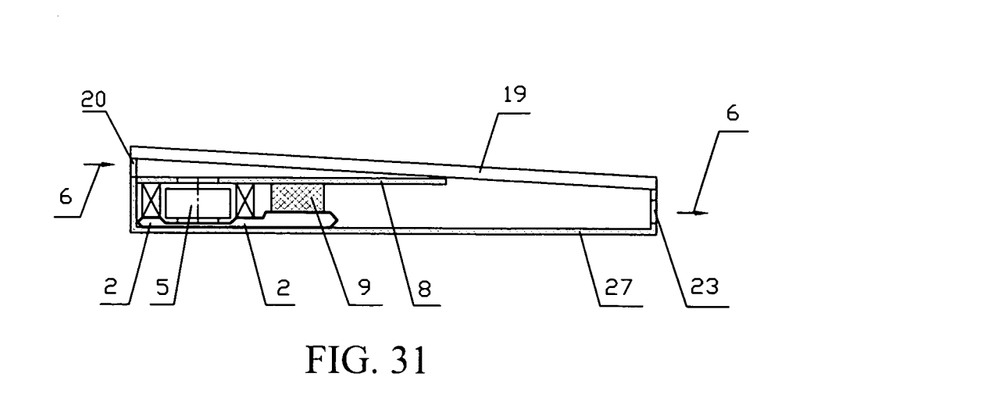

FIGS. 30 and 31 show the characteristic structure of the flat-panel computer which adopts the radiator of the present invention. It includes a display screen 19, a shell 27, a motherboard 8, batteries, and a hard disc (batteries and hard disc are not shown in the figures). The heat pipe 2 is flat and pasted on the wall of the shell 27. The advantages of this structure include that the wall of the shell is used as additional heat exchange surface, so the heat dissipating capacity is increased without adding room or components, and the radiator size can be reduced. The heat dissipating process of the shell wall includes radiation heat transfer and air convection heat transfer.

Whatever the radiation heat transfer or the convective heat transfer, the temperature of the heat transfer surface should be high enough. The plate structure heat pipe of the present invention has enough large heat transfer surface, wherein the thickness is thin, the contact area is large, and the heat pipe's temperature is high and even, so the effective area of heat transfer is large. Using directly the heat pipe's wall as the shell's wall, not only eliminate the contact heat resistance between heat pipe 2 and shell 27, but also can cut down the thickness further.

In FIG. 30, the motherboard 8 is parallel with and close to the display screen 19, the heat pipe 2 is pasted on the wall of the shell 27, the air inlet 20 is opened on the wall of shell 27. The air outlet 23 is far away from air inlet 20.

In FIG. 31, the air inlet 20 is opened on the sidewall of the shell 27, compared with what FIG. 24 shows, it is harder to be blocked. The motherboard 8 has an airflow orifice which faces the fan 5, and there is an angle between the motherboard 8 and the display screen 29, it is to make the air inlet channel larger.

Figure 32:
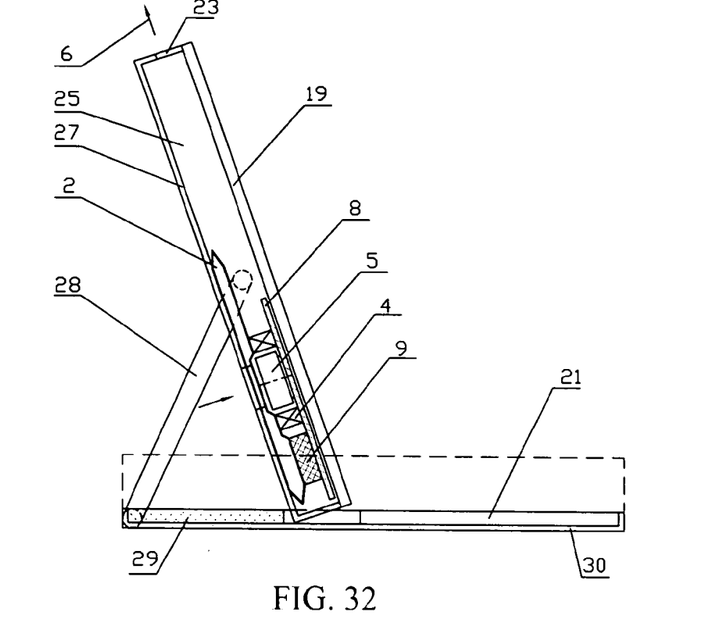
FIGS. 32 and 33 are another perspective view of the flat type of heat pipe of the flat radiator according to the preferred embodiment of the present invention, illustrating the flat type of heat pipe incorporating with the portable computers having similar structure as the existing portable computers.
Figure 33:
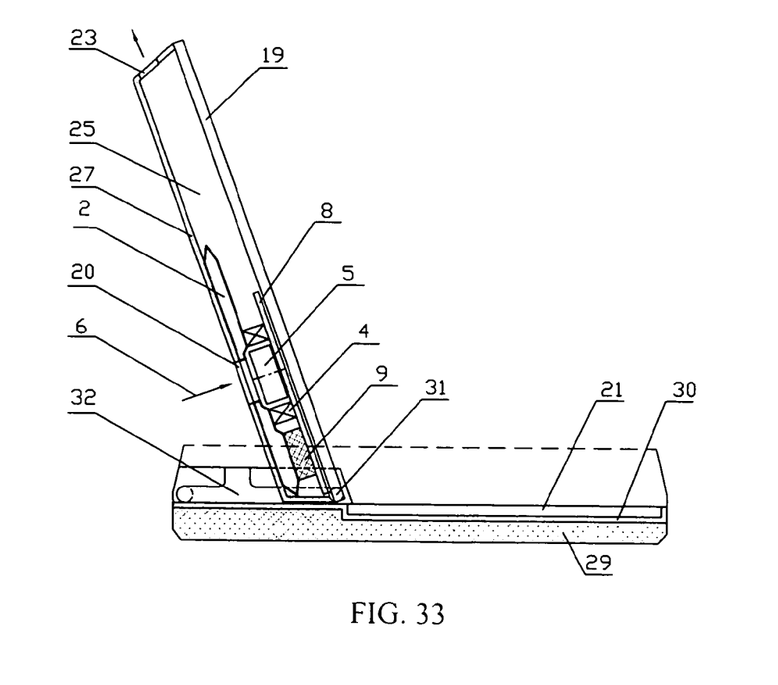

The portable computers shown in FIGS. 32 and 33 have the mainframe 25 and the screen cover 30, the display screen 19 is on the mainframe 25, and there are the motherboard 8, the battery and hard disc (not shown) in the mainframe 25, the radiator of the CPU or GPU 9 is one kind of the present invention, the heat pipe 2 is a plate structure and is keep close to the shell 27, the keyboard 21 is set on the screen cover 30. The computer in the Figures is in open state, the mainframe 25 stands up askew on the interior of the screen cover 30, the screen cover 30 is as the base of the mainframe 25 to make it stable. The broken line in the Figures expresses the closed state of the mainframe 25 and the screen cover 30 which protects the display screen 19. The heat pipe 2 is pasted on the wall of the shell 27 to make use of the wall of the shell 27 as heat dissipation surface, and the effect of radiation heat transfer and air convection heat transfer is best when the mainframe is upright.

If setting the heat pipe as a part or whole of the shell, using the shell's wall as the pipe's wall, the contact heat resistance can be eliminated, and the radiator can be reduced further. The display screen is on the mainframe, and stands up when used, the keyboard is on the screen cover, it is different from nowaday notebooks. The advantages include that: 1. the heat dissipating capacity is increased, the air inlets and outlets are not blocked easily; 2. it needs only a shell and the display shell is saved, so the computer thickness is decreased; 3. the keyboard can be of several kinds of structures, like the thin film key-press; 4. the screen cover not only protects the display screen, but also be as the base of the mainframe when upright, and we can set a battery in the screen cover as backup battery, which can be replaced conveniently.

In FIGS. 32 and 33, the CPU or GPU 9 is set near the bottom of the mainframe 25, the fan 5 and the air convective extended heat exchange surface 4 are up, wherein the heat pipe vaporizing area is below, the working liquid flows back by gravity, so the heat flux of this heat pipe is high, we can use the simple heat pipe of a heat siphon structure. The air outlet 23 should be as high as possible, just like the highest position shown in the figures, and the CPU or GPU chip is set as low as possible, The purposes are that: 1. the hot air in shell can be dissipated equally, other components can be also cooled; 2. using the empty room in shell, a pump effect is formed like a chimney to improve air convection and the whole heat dissipating.

In FIG. 32, there are a backup batteries 29 and a keyboard 21 on the screen shell 30, they are on the same side and their thickness is the same. The mainframe 25 is sustained by the strut 28. The connection between the screen cover 30 and the mainframe 25 is also the strut 28. The power and electrical signal wires between the screen cover 30 and the mainframe 25 can be set in the struts 28. The connection between the strut 28 and the mainframe 25 or the screen cover 30 can be designed to be easily divided, so that the mainframe 25 and the screen cover can be separated easily. Then, the mainframe 25 becomes a flat-panel computer, it will be convenient for users.

In FIG. 33, there is no struts and there are two runners 32 on both sidewalls of the screen cover 30, and there are sliding axles 31 on the mainframe 25. The connection between the mainframe 25 and the screen cover 30 is by the connection between the runners and the sliding axles, the mainframe 25 can be sustained also by the sliding axles with the runners. There are electric touch points on the mainframe 25 and the screen cover 30 for the electrical connection between the mainframe 25 and the screen cover 30.

FIG. 33 shows that there are openings at the outside on the runner 32, the sliding axle 31 on the mainframe 25 can slide off from the openings, so the mainframe 25 can be separated easily from the screen cover 30. The backup battery 29 is set on the surface of the cover 30, and they can be designed having different kinds of capacities and thicknesses and be replaced at any moment. If long operation time is needed, user can choose a larger backup battery conveniently, the capacity of backup battery maybe more than the battery in the mainframe. When users need handiness, they can choose the lighter and thinner backup batteries.

It is appreciated that the hard discs in the present invention include mechanism hard discs and solid state discs.

It will thus be seen that the objects of the present invention have been fully and effectively achieved. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A flat radiator with heat pipe for cooling electronic chips, comprising at least one heat pipe, at least one air convective extended heat exchange surface, and one or more fans, wherein said fan is a centrifugal type, wherein said heat pipe is a plate type, or a flat tubular heat pipe in a single row, or several tubular heat pipes arranged side by side, wherein said air convective extended heat exchange surface adopts a fin structure, and surrounds an impeller of said fan, and is facing the air outlet of said impeller; and more than half of said fins surrounding said impeller are arranged in an arc shape; and said fins in an arc shape and surrounding said impeller have a structure that the fin blades of said fins incline toward the rotating direction of said impeller or said fins in an arc shape and surrounding said impeller have a structure that the fin blades of said fins are bended and the channel between the two adjacent banded fin blades is not straight, and the air inlet front edge of said fin blade bends against the rotating direction of said impeller, wherein said fins have an intensifying air convection heat transfer structure that the surface of the fin blade of said fins is cut into several discontinuous segments to form a staggered short fin structure.

* * * * *